United States Patent
Ho et al.

(10) Patent No.: US 8,759,958 B2
(45) Date of Patent: Jun. 24, 2014

(54) SEMICONDUCTOR PACKAGE AND METHOD OF MANUFACTURING THE SAME

(75) Inventors: Dong-Ki Ho, Asan-si (KR); Boseong Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 481 days.

(21) Appl. No.: 12/658,646

(22) Filed: Feb. 12, 2010

(65) Prior Publication Data

US 2010/0213591 A1 Aug. 26, 2010

(30) Foreign Application Priority Data

Feb. 20, 2009 (KR) ........................ 10-2009-0014454

(51) Int. Cl.
*H01L 23/02* (2006.01)
*H01L 23/48* (2006.01)
*H01L 23/52* (2006.01)
*H01L 29/40* (2006.01)

(52) U.S. Cl.
USPC ........... 257/686; 257/693; 257/738; 257/777; 257/E23.028; 257/E23.069; 257/E23.175

(58) Field of Classification Search
None
See application file for complete search history.

(56) References Cited

U.S. PATENT DOCUMENTS

| | | | | |
|---|---|---|---|---|
| 4,783,722 A * | 11/1988 | Osaki et al. | .................. | 361/779 |
| 4,897,918 A * | 2/1990 | Osaka et al. | .................... | 29/830 |
| 5,251,806 A * | 10/1993 | Agarwala et al. | ........ | 228/180.22 |
| 5,641,113 A * | 6/1997 | Somaki et al. | ........... | 228/180.22 |
| 5,956,606 A * | 9/1999 | Burnette | ........................ | 438/615 |
| 6,075,279 A * | 6/2000 | Andoh | ......................... | 257/620 |
| 6,346,434 B1 * | 2/2002 | Andoh | ......................... | 438/118 |
| 6,424,037 B1 * | 7/2002 | Ho et al. | ....................... | 257/738 |
| 6,583,354 B2 * | 6/2003 | Alcoe | ........................... | 174/525 |
| 7,666,777 B2 * | 2/2010 | Bauer et al. | ................... | 438/612 |
| 2002/0084517 A1 * | 7/2002 | Solo De Zaldivar et al. | . | 257/668 |
| 2002/0151164 A1 * | 10/2002 | Jiang et al. | ..................... | 438/613 |
| 2004/0094842 A1 * | 5/2004 | Jimarez et al. | ................ | 257/772 |
| 2005/0184377 A1 * | 8/2005 | Takeuchi et al. | .............. | 257/686 |
| 2006/0012028 A1 * | 1/2006 | Usui et al. | ..................... | 257/700 |
| 2006/0094223 A1 * | 5/2006 | Tsai | ................................ | 438/612 |
| 2006/0102996 A1 * | 5/2006 | Han et al. | ...................... | 257/686 |
| 2006/0110849 A1 * | 5/2006 | Lee et al. | ...................... | 438/106 |
| 2006/0267175 A1 * | 11/2006 | Lee | ................................ | 257/686 |
| 2008/0073769 A1 * | 3/2008 | Wu et al. | ....................... | 257/686 |
| 2008/0230887 A1 * | 9/2008 | Sun et al. | ...................... | 257/686 |
| 2009/0032927 A1 * | 2/2009 | Kim et al. | ...................... | 257/686 |
| 2009/0174071 A1 * | 7/2009 | Chao et al. | .................... | 257/737 |
| 2010/0171207 A1 * | 7/2010 | Shen et al. | .................... | 257/686 |
| 2011/0117700 A1 * | 5/2011 | Weng et al. | .................... | 438/109 |
| 2011/0215464 A1 * | 9/2011 | Guzek et al. | .................. | 257/737 |

FOREIGN PATENT DOCUMENTS

| | | |
|---|---|---|
| KR | 2001-0004610 A | 1/2001 |
| KR | 10-0608327 B1 | 7/2006 |
| KR | 10-0722634 B1 | 5/2007 |

* cited by examiner

*Primary Examiner* — Hoang-Quan Ho
(74) *Attorney, Agent, or Firm* — Onello & Mello, LLP

(57) ABSTRACT

A semiconductor package includes a first package and a second package, a connection terminal disposed between the first and second packages and including a first solder ball and a second solder ball that are vertically stacked, a solder passivation layer with which a surface of at least one of the first and second solder balls is coated, and a ring-shaped short prevention part surrounding a coupling portion between the first and second solder balls.

13 Claims, 13 Drawing Sheets

SEMICONDUCTOR PACKAGE AND METHOD OF MANUFACTURING THE SAME

CROSS-REFERENCE TO RELATED APPLICATIONS

This U.S. non-provisional patent application claims priority under 35 U.S.C. §119 of Korean Patent Application No. 10-2009-0014454, filed in the Korean Intellectual Property Office on Feb. 20, 2009, the entire contents of which are hereby incorporated by reference.

BACKGROUND

The present inventive concept described herein relates to a semiconductor package, and more particularly, to a stack semiconductor package and a method of manufacturing the stack semiconductor package.

A typical stack package includes a plurality of packages that are stacked. For example, stacked packages of a stack package such as a package on package (POP) include solder balls therebetween. The solder balls are used as connection terminals that electrically connect semiconductor integrated circuit (IC) chips of the packages. The solder balls are also used as supports maintaining the distance between the packages.

Recently, the number of semiconductor integrated circuit chips stacked in semiconductor packages has increased to improve the integration of the semiconductor packages. Since the semiconductor integrated circuit chips are disposed between the semiconductor packages, the distance between the semiconductor packages should be increased to increase the number of the stacked semiconductor integrated circuit chips. To this end, the sizes (e.g. diameters) of solder balls may be increased. However, as the sizes of the solder balls are increased, the pitches are also increased. This makes it difficult to achieve a fine ball pitch.

SUMMARY

The present inventive concept provides a semiconductor package having a fine ball pitch, and a method of manufacturing the semiconductor package.

The present inventive concept also provides a semiconductor package having high integration, and a method of manufacturing the semiconductor package.

According to a first aspect, the inventive concept is directed to a semiconductor package including: a first package and a second package; a connection terminal disposed between the first and second packages and including a first solder ball and a second solder ball that are stacked; and a solder passivation layer with which a surface of at least one of the first and second solder balls is coated.

In some embodiments, the solder passivation layer may include a metal that has a higher melting point than that of the connection terminal.

In some embodiments, the semiconductor package may further include a ring-shaped short prevention part that surrounds a coupling portion between the first and second solder balls, and that prevents an electrical short of the connection terminal.

In some embodiments, the solder passivation layer may include at least one of copper (Cu), nickel (Ni), gold (Au), titanium (Ti), tungsten (W), chromium (Cr), and vanadium (V).

According to another aspect, the inventive concept is directed to a method of manufacturing a semiconductor package including: preparing a first package provided with a first solder ball; preparing a second package provided with a second solder ball; planarizing the first solder ball to form a flat surface; forming a solder passivation layer with which a surface of the first solder ball is coated, the solder passivation layer having an attachment surface covering the flat surface; disposing the first and second packages to position the second solder ball on the flat surface of the first solder ball; and coupling the first and second solder balls to each other to form a connection terminal.

In some embodiments, the forming of the solder passivation layer may include forming a metal that has a higher melting point than that of the connection terminal.

In some embodiments, the forming of the connection terminal may include reflowing the first and second solder balls at a temperature that is higher than a melting point of the connection terminal and lower than a melting point of the solder passivation layer.

In some embodiments, the method may further include: forming an insulating layer on the first solder ball, the insulating layer having a greater diameter than that of the attachment surface; and partially removing the insulating layer to expose the attachment surface and form a ring-shaped short prevention part that is disposed along an edge of the attachment surface.

In some embodiments, the forming of the insulating layer may include forming a layer that includes at least one of a photo solder resist (PSR) and a resin adhesive.

In some embodiments, the forming of the connection terminal may include confining a melted portion of the second solder ball in the attachment surface by the short prevention part to attach the second solder ball to the first solder ball.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION OF THE EMBODIMENTS

Figure 1A:
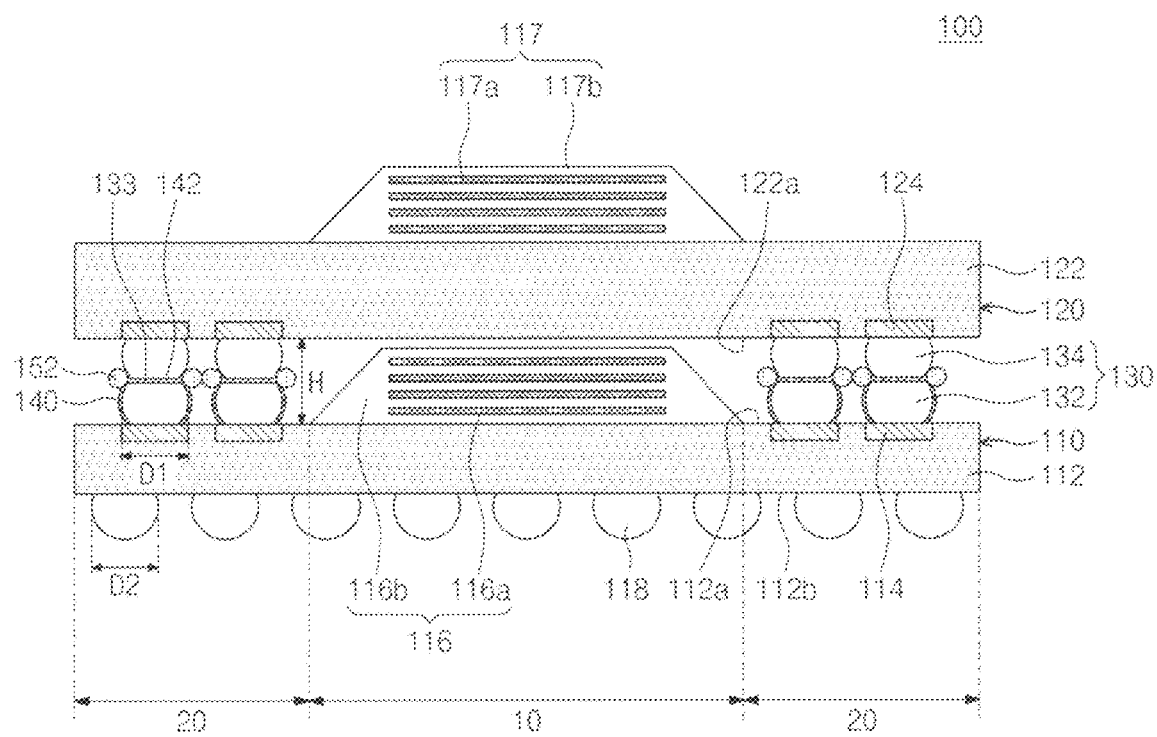
FIGS. 1A and 1B are schematic views illustrating a semiconductor package according to an embodiment of the inventive concept.

Preferred embodiments of the inventive concept will be described below in more detail with reference to the accompanying drawings. The inventive concept may, however, be embodied in different forms and should not be constructed as limited to the embodiments set forth herein. Rather, these embodiments are provided so that this description will be thorough and complete, and will fully convey the inventive concept to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Figure 1B:
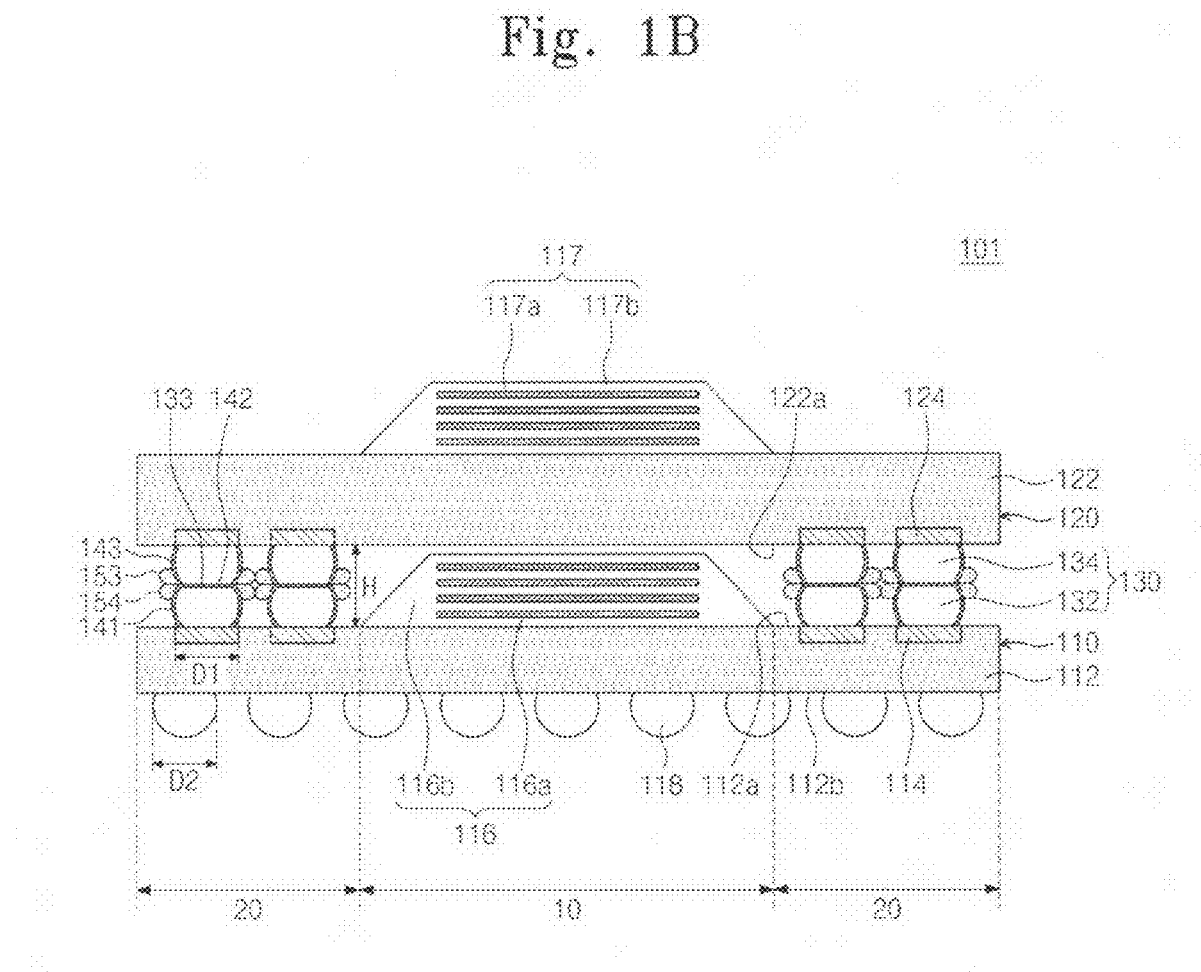

FIGS. 1A and 1B are schematic views illustrating semiconductor packages 100 and 101 according to an embodiment of the inventive concept.

Referring to FIG. 1A, the semiconductor package 100 may be a package on package (POP) in which a plurality of packages are stacked.

For example, the semiconductor package 100 may include a first package 110 and a second package 120 with a connection terminal 130 disposed therebetween. The first and second packages 110 and 120 may be independent packages on which semiconductor chips are mounted.

The first package 110 may include a first substrate 112, an electrical device 116, and external connection terminals 118. The first substrate 112 may include a printed circuit board (PCB). The first substrate 112 may have an upper surface 112a where first connection pads 114 are disposed, and a lower surface 112b disposed on the opposite side to the upper surface 112a. The electrical device 116 may be disposed in a center 10 of the upper surface 112a. The electrical device 116 may include at least one semiconductor integrated circuit (IC) chip. For example, the electrical device 116 may include a plurality of stacked semiconductor integrated circuit chips 116a and a chip passivation layer 116b covering the semiconductor integrated circuit chips 116a. The chip passivation layer 116b may be formed of epoxy molding compound (EMC). The external connection terminals 118 may be disposed on the lower surface 112b. The external connection terminals 118 may include solder balls. The external connection terminals 118 may be used to connect the first substrate 112 to an external device (not shown).

The second package 120 may include a second substrate 122 that is substantially parallel to the first substrate 112. The second substrate 122 may include a printed circuit board. The second substrate 122 may include an electrical device 117 mounted on the printed circuit board. The electrical device 117 may include at least one semiconductor integrated circuit (IC) chip. For example, the electrical device 117 may include a plurality of stacked semiconductor integrated circuit chips 117a and a chip passivation layer 117b covering the semiconductor integrated circuit chips 117a. The chip passivation layer 117b may be formed of epoxy molding compound (EMC). The second substrate 122 may have a surface 122a where second connection pads 124 are disposed. The surface 122a faces the upper surface 112a.

The connection terminals 130 may be disposed in edges 20 of the first and second substrates 112 and 122. The connection terminals 130 may include solder balls that are vertically arrayed. For example, the connection terminals 130 may include first solder balls 132 and second solder balls 134 that are stacked. The first solder balls 132 may be attached to the first connection pads 114 on the upper surface 112a. The second solder balls 134 may be attached to the second connection pads 124 on the surface 122a. The first solder balls 132 may have flat surfaces. For example, the first solder balls 132 may have flat surfaces 133 in upper portions. The flat surfaces 133 may be substantially parallel to the upper surface 112a of the first substrate 112. The flat surfaces 133 may be formed by planarizing approximate sphere shapes of the first solder balls 132. The flat surfaces 133 may be used to effectively attach the second solder balls 134 onto the first solder balls 132. The connection terminals 130 may electrically connect the first package 110 to the second package 120. Furthermore, the connection terminals 130 may be supports maintaining the distance between the first package 110 and the second package 120.

The sizes of the first and second solder balls 132 and 134 may be less than or equal to the sizes of the external connection terminals 118. For example, a diameter D1 of the first and second solder balls 132 and 134 may be less than or equal to a diameter D2 of the external connection terminal 118. As the diameter D1 of the first and second solder balls 132 and 134 is increased, the pitch of the connection terminals 130 may be increased. On the other hand, as the diameter D1 of the first and second solder balls 132 and 134 is decreased, a height H of the connection terminals 130 is decreased, so that the distance between the first and second packages 110 and 120 is decreased. Thus, the diameter D1 of the first and second solder balls 132 and 134 may be adjusted to minimize the pitch of the connection terminals 130 and maximize the distance between the first and second packages 110 and 120.

The semiconductor package 100 may include solder passivation layers 140 and short prevention parts 152. The solder passivation layers 140 may cover at least one of the first and second solder balls 132 and 134. For example, the solder passivation layer 140 may have a uniform thickness to cover the surface of the first solder ball 132. Accordingly, the surfaces of the first solder balls 132 may be coated with the solder passivation layers 140 having a uniform thickness. Since the first solder balls 132 have the flat surfaces 133, the solder passivation layers 140 may have attachment surfaces 142 to flatly cover the flat surfaces 133. The attachment surfaces 142 may be in direct contact with the first solder balls 132. The solder passivation layers 140 may be formed of a material that has a higher melting point than that of the connection terminals 130. Furthermore, the solder passivation layers 140 may be formed of a material that has a greater strength than that of the connection terminals 130. For example, when the connection terminals 130 are formed of metal containing at least one of stannum (Sn), lead (Pb), and silver (Ag), the solder passivation layers 140 may be formed of metal containing at least one of copper (Cu), nickel (Ni), gold (Au), titanium (Ti), tungsten (W), chromium (Cr), and vanadium (V). The solder passivation layers 140 may be substantially in direct contact with the second solder balls 134 to electrically connect the first solder balls 132 to the second solder balls 134.

The short prevention parts 152 may be disposed between the connection terminals 130. For example, the short prevention parts 152 may surround the connection terminals 130, respectively. The short prevention parts 152 may have a ring shape to surround the coupling portion between the first and second solder balls 132 and 134. In this case, the short prevention part 152 covering one of the connection terminals 130 may be spaced apart from the short prevention part 152 covering the adjacent connection terminal 130. Accordingly, the short prevention parts 152 respectively covering the connection terminals 130 are spaced apart from each other. The short prevention parts 152 may be formed of an insulating material. For example, the short prevention parts 152 may be formed of a material including at least one of photo solder resist (PSR) and resin-based adhesive. The short prevention parts 152 inhibit an electrical short between the connection terminals 130.

According to the current embodiment, the semiconductor package 100 may include the first and second packages 110 and 120, and the connection terminals 130 that are formed by vertically stacking the first and second solder balls 132 and 134, and that are disposed between the first and second packages 110 and 120. The semiconductor package 100 configured as described above decreases the pitch of the connection terminals 130 to achieve a fine ball pitch, and increases the distance between the first package 110 and the second package 120. Accordingly, the semiconductor package 100 is configured to increase the number of the semiconductor integrated circuit chips 116a disposed between the first package 110 and the second package 120, thus improving the integration of the semiconductor package 100.

Referring to FIG. 1B, the semiconductor package 101 may be a package on package (POP) in which a plurality of packages are stacked. The same description as the above description of the semiconductor package 101 will be omitted or simplified.

The connection terminals 130 may be disposed in edges 20 of the first and second substrates 112 and 122. The connection terminals 130 may include solder balls that are vertically arrayed. For example, the connection terminals 130 may include first solder balls 132 and second solder balls 134 that are stacked. The first solder balls 132 may be attached to the first connection pads 114 on the upper surface 112a. The second solder balls 134 may be attached to the second connection pads 124 on the surface 122a. The first solder balls 132 may have flat surfaces. For example, the first solder balls 132 may have flat surfaces 133 in upper portions. The flat surfaces 133 may be substantially parallel to the upper surface 112a of the first substrate 112. The flat surfaces 133 may be formed by planarizing approximate sphere shapes of the first solder balls 132. The flat surfaces 133 may be used to effectively attach the second solder balls 134 onto the first solder balls 132. The connection terminals 130 may electrically connect the first package 110 to the second package 120. Furthermore, the connection terminals 130 may be supports maintaining the distance between the first package 110 and the second package 120.

The semiconductor package 101 may include first and second solder passivation layers 141 and 143 and first and second short prevention parts 153 and 154.

The first solder passivation layers 141 may cover the first solder balls 132. The second solder passivation layers 143 may cover the second solder balls 134. Since the first solder balls 132 have the flat surfaces 133, the solder passivation layers 140 may have attachment surfaces 142 to flatly cover the flat surfaces 133.

The short prevention parts 153 and 154 may be disposed between the first solder balls 132 and the second solder balls 134. For example, first short prevention parts154 may surround the top surface of the first solder balls 132 and second prevention parts 153 may surround the bottom surface of the second solder balls 134. The short prevention parts 153 and 154 may have a ring shape to surround the coupling portion between the first and second solder balls 132 and 134. In this case, the short prevention part 153 and 154 covering one of the connection terminals 130 may be spaced apart from the short prevention part 153 and 154 covering the adjacent connection terminal 130. Accordingly, the short prevention parts 153 and 154 respectively covering the connection terminals 130 are spaced apart from each other. The short prevention parts 153 and 154 may be formed of an insulating material. For example, the short prevention parts 153 and 154 may be formed of a material including at least one of photo solder resist (PSR) and resin-based adhesive. The short prevention parts 153 and 154 inhibit an electrical short between the connection terminals 130.

Hereinafter, methods of manufacturing the semiconductor packages 100 and 101 will now be described in detail. The same description as the above description of the semiconductor packages 100 and 101 will be omitted or simplified.

FIGS. 2A through 2F are schematic views illustrating a method of manufacturing the semiconductor package 100 according to an embodiment of the inventive concept. FIG. 3A is a schematic view illustrating a method of forming the short prevention parts 152 according to an embodiment of the inventive concept. FIG. 3B is a schematic view illustrating a method of forming the short prevention parts 152 according to another embodiment of the inventive concept.

Figure 2A:
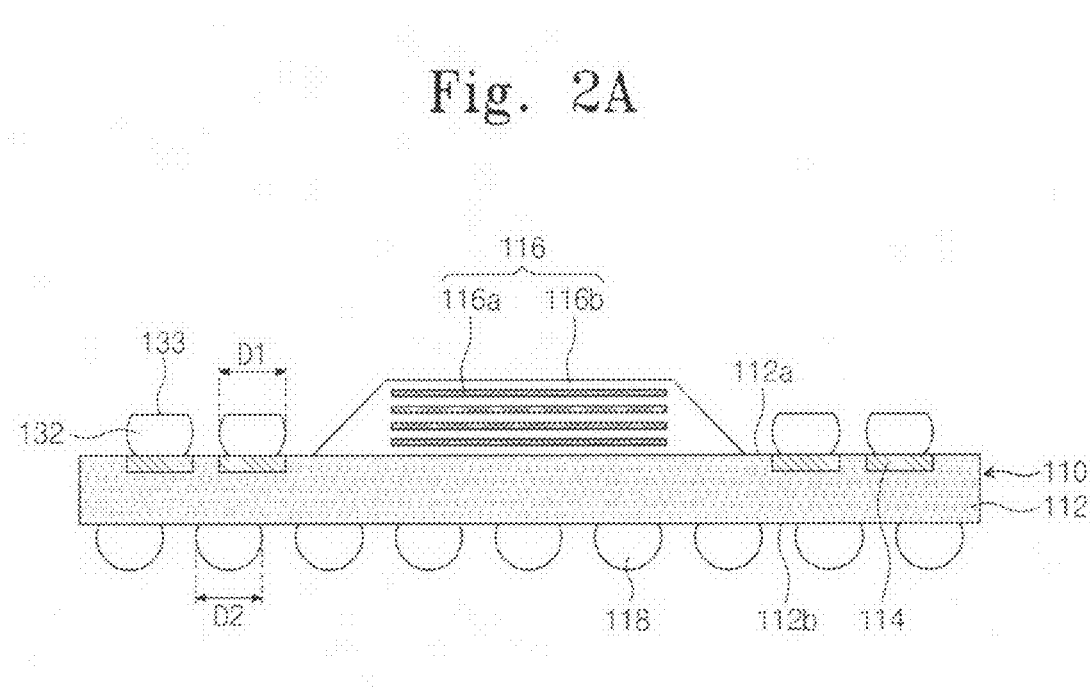
FIGS. 2A through 2F are schematic views illustrating a method of manufacturing a semiconductor package according to an embodiment of the inventive concept.
Figure 3A:
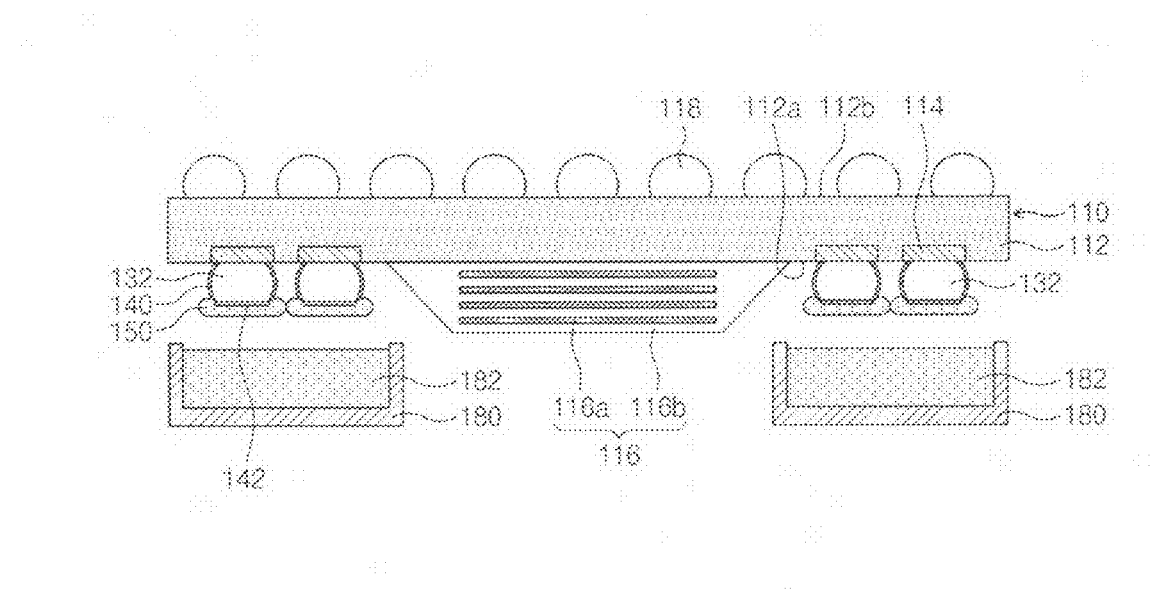
FIG. 3A is a schematic view illustrating a method of forming short prevention parts according to an embodiment of the inventive concept.
Figure 3B:
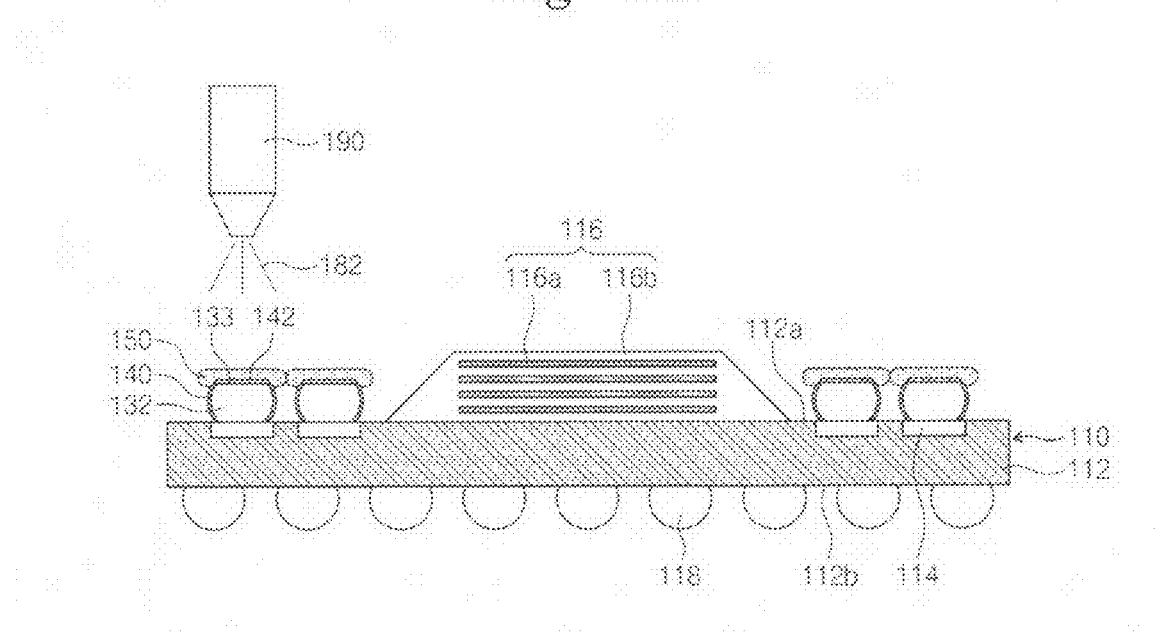
FIG. 3B is a schematic view illustrating a method of forming short prevention parts according to another embodiment of the inventive concept.

Referring to FIG. 2A, the first package 110 may be prepared. The preparing of the first package 110 may include preparing the first substrate 112 having the upper surface 112a and the lower surface 112b disposed on the opposite side to the upper surface 112a. The preparing of the first substrate 112 may include forming the electrical device 116 on the upper surface 112a, and forming the external connection terminals 118 on the lower surface 112b. The forming of the electrical device 116 may include stacking the semiconductor integrated circuit chips 116a, and forming the chip passivation layer 116b covering the semiconductor integrated circuit chips 116a. Further, the preparing of the first substrate 112 may include forming the first connection pads 114 in the upper surface 112a, and attaching the first solder balls 132 onto the first connection pads 114. At this point, the diameter D1 of the first solder balls 132 may be equal to or less than the diameter D2 of the external connection terminals 118. Further, the preparing of the first substrate 112 may include forming the flat surfaces 133 on the first solder balls 132. The forming of the flat surfaces 133 may include planarizing the upper portions of the first solder balls 132. For example, the forming of the flat surfaces 133 may include coining the first solder balls 132. In this case, the forming of the flat surfaces 133 may further include heat-treating the first solder balls 132. Alternatively, the forming of the flat surfaces 133 may include polishing or grinding the upper portions of the first solder balls 132.

Figure 2B:
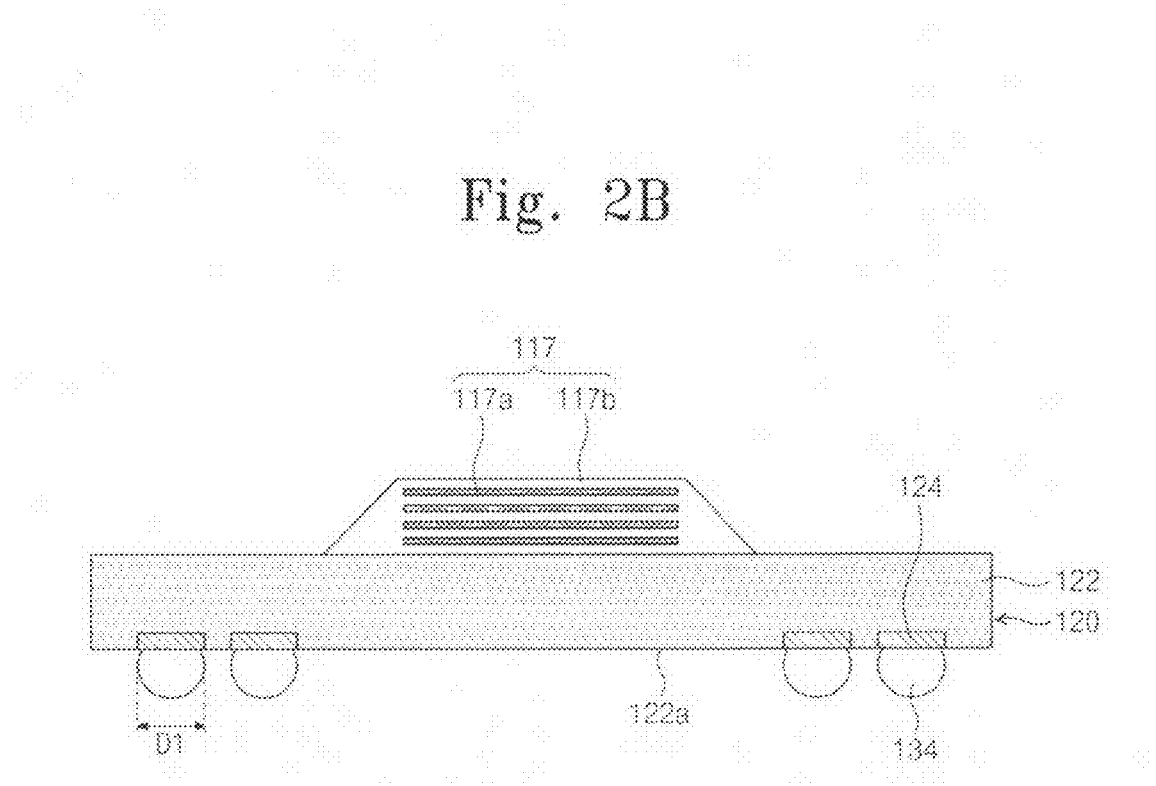

Referring to FIG. 2B, the second package 120 may be prepared. The preparing of the second package 120 may include preparing the second substrate 122 having the surface 122a provided with the second connection pads 124, and attaching the second solder balls 134 onto the second connection pads 124. At this point, the diameter D1 of the second solder balls 134 may be equal to or less than the diameter D2 of the external connection terminals 118 (refer to FIG. 2A), and the diameter D1 of the second solder balls 134 may be approximately equal to the diameter D1 of the first solder balls 132 (refer to FIG. 2A). Further, the preparing of the second package 120 may include forming an electrical device 117. The forming of the electrical device 117 may include stacking the semiconductor integrated circuit chips 117a, and forming the chip passivation layer 117b covering the semiconductor integrated circuit chips 117a.

Figure 2C:
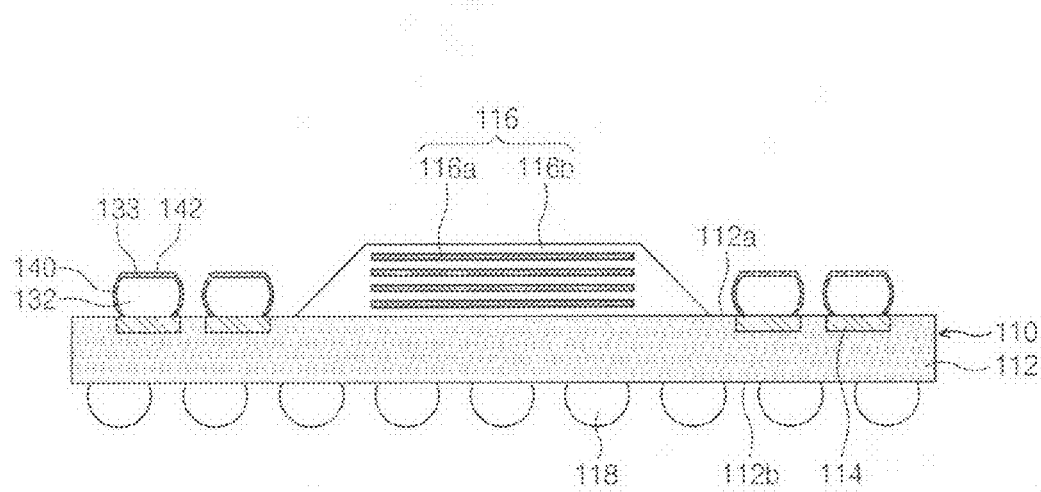

Referring to FIG. 2C, the solder passivation layers 140 may be formed. The forming of the solder passivation layers 140 may include forming conductive layers that cover at least one group of the first solder balls 132 and the second solder balls 134 (refer to FIG. 2B). For example, the forming of the solder passivation layers 140 may include forming metal layers that have a uniform thickness to cover the surfaces of the first solder balls 132. Accordingly, the solder passivation layers 140 may have a uniform thickness to coat the surfaces of the first solder balls 132. At this point, the solder passivation layers 140 may have the attachment surfaces 142 that flatly cover the flat surfaces 133.

The solder passivation layers 140 may be formed of metal that has a higher melting point than that of the first solder balls 132. Furthermore, the solder passivation layers 140 may be formed of metal that has a greater strength than that of the first solder balls 132. For example, the solder passivation layers 140 may be formed of metal containing at least one of copper (Cu), nickel (Ni), gold (Au), titanium (Ti), tungsten (W), chromium (Cr), and vanadium (V). The solder passivation layers 140 may be formed through a plating process. For example, the forming of the solder passivation layers 140 may include coating only the surfaces of the first solder balls 132 with metal layers through an electroless plating process or an electro plating process.

Figure 2D:
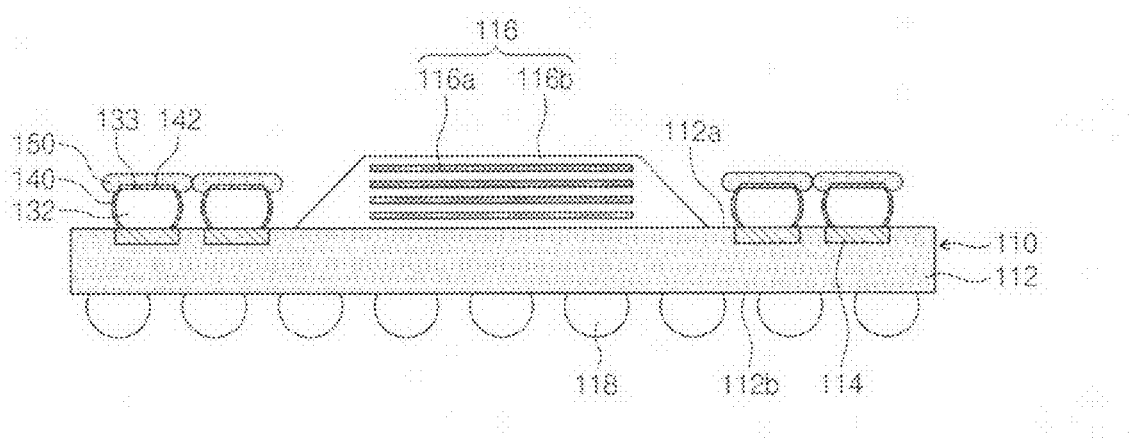

Referring to FIG. 2D, insulating layers 150 may be formed on the first solder balls 132. For example, referring to FIG. 3A, the forming of the insulating layers 150 may include preparing containers 180 filled with an insulating material 182, positioning the first package 110 such that the first solder balls 132 face the containers 180, and bring portions (e.g. the attachment surfaces 142) of the solder passivation layers 140 in contact with the top surface of the insulating material 182. Alternatively, referring to FIG. 3B, the forming of the insulating layers 150 may include supplying the insulating material 182 on the first solder balls 132 of the first package 110 using an applier 190. In this case, the forming of the insulating layers 150 may further include removing a portion of the insulating material 182 formed in the region except for the attachment surfaces 142 of the solder passivation layers 140. At this point, the diameters of the insulating layers 150 may be greater than the diameters of the attachment surfaces 142. The insulating material 182 may include at least one of photo solder resist (PSR) and resin-based adhesive. Through the forming of the insulating layers 150, the insulating layers 150 approximately horizontal to the attachment surfaces 142 may be formed on the attachment surfaces 142 of the solder passivation layers 140.

Figure 2E:
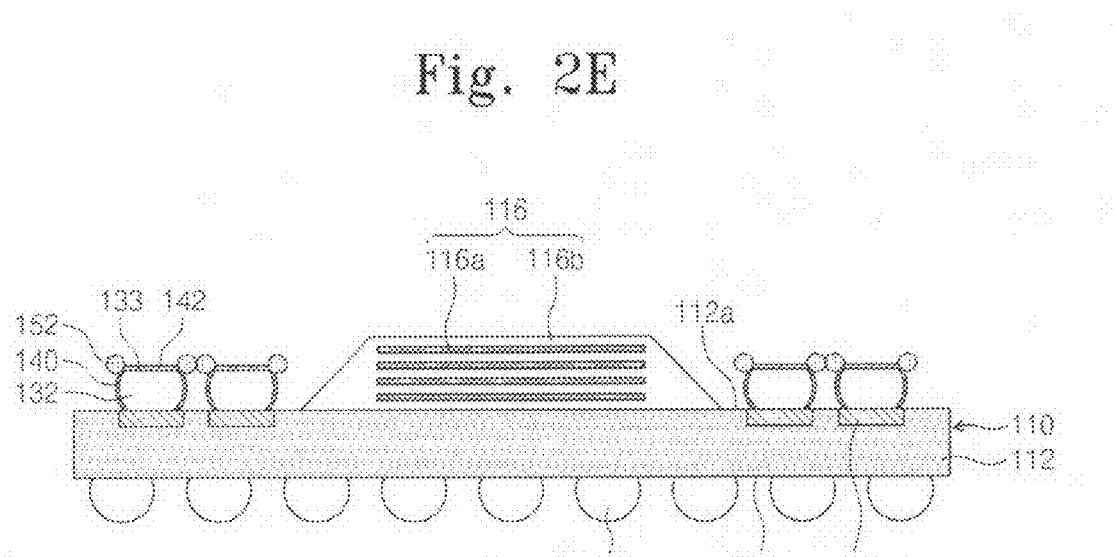

Referring to FIG. 2E, the short prevention parts 152 may be formed. The short prevention parts 152 may be formed by removing portions of the insulating layers 150 to expose the attachment surfaces 142 of the solder passivation layers 140. For example, the removing of the portions of the insulating layers 150 may include performing an exposure process on the insulating layers 150. The performing of the exposure process may include irradiating light on only the centers of the insulating layers 150 to expose the attachment surfaces 142. When the insulating layers 150 are photo solder resist, only the centers of the insulating layers 150 may be removed through the exposure process. Alternatively, the removing of the portions of the insulating layers 150 may include removing the centers of the insulating layers 150 using a laser beam to expose the attachment surfaces 142. Alternatively, the removing of the portions of the insulating layers 150 may include grinding the insulating layers 150 until the attachment surfaces 142 are exposed. As described above, the short prevention parts 152 may be formed at the edges of the attachment surfaces 142 of the solder passivation layers 140. For example, the insulating layers 150 may be formed at only the edges of the attachment surfaces 142 when the centers of the insulating layers 150 are removed since the diameters of the insulating layers 150 are greater than those of the attachment surfaces 142. Accordingly, the short prevention parts 152 are disposed at the edges of the attachment surfaces 142 to form ring shapes.

Figure 2F:
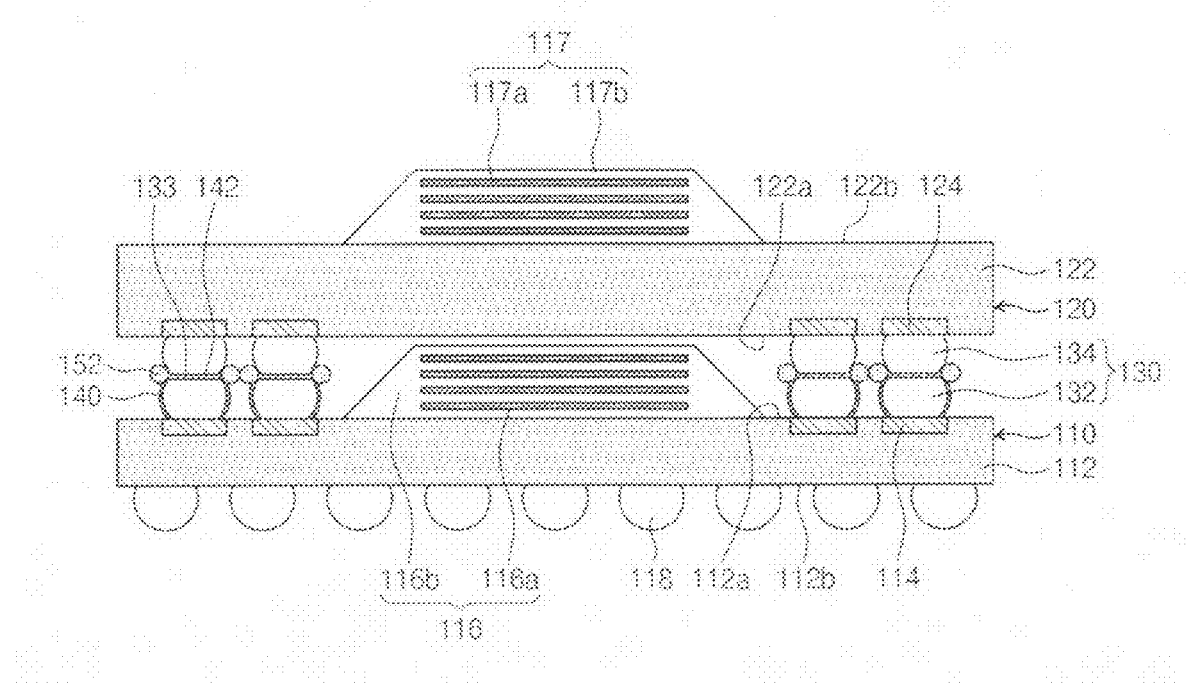

Referring to FIG. 2F, the first package 110 may be coupled to the second package 120. The coupling of the first and second packages 110 and 120 may include positioning the second solder balls 134 on the flat surfaces 133 of the first solder balls 132, and heat-treating the first and second solder balls 132 and 134. The heat-treating may include reflowing the first and second solder balls 132 and 134 at a temperature that is higher than the melting points of the first and second solder balls 132 and 134 and lower than the melting point of the solder passivation layers 140. In this case, during the reflowing of the first and second solder balls 132 and 134, the first solder balls 132 passivated by the solder passivation layers 140 may maintain their shapes. Accordingly, the connection terminals 130, including the vertically stacked first and second solder balls 132 and 134 between the first and second packages 110 and 120, may be formed. Since the solder passivation layers 140 are formed of metal, the first and second solder balls 132 and 134 are electrically connected to each other through the solder passivation layers 140.

During the heat-treating of the first and second solder balls 132 and 134, the short prevention parts 152 may prevent melted portions of the second solder balls 134 from expanding to the adjacent connection terminals 130. For example, during the heat-treating of the first and second solder balls 132 and 134, the surface tension between the melted portions of the second solder balls 134 and the attachment surfaces 142 may be greater than that between the melted portions and the short prevention parts 152. Accordingly, the second solder balls 134 may be attached to only the attachment surfaces 142. The upper portions of the short prevention parts 152 may be higher than the attachment surfaces 142 of the solder passivation layers 140. Thus, the short prevention parts 152 may function as steps that prevent the melted portions of the second solder balls 134 from flowing out of the attachment surfaces 142 during the heat-treating of the first and second solder balls 132 and 134. Accordingly, the short prevention parts 152 may guide the melted portions of the second solder balls 134 such that the second solder balls 134 are attached to only the attachment surfaces 142.

According to the current embodiment, the semiconductor package 100 may include the first package 110 coupled to the second package 120 through the connection terminals 130. Since the connection terminals 130 include the vertically stacked first and second solder balls 132 and 134, the distance between the first and second packages 110 and 120 is increased. Accordingly, the number of the semiconductor integrated circuit chips 116a disposed between the first and second packages 110 and 120 is increased to improve the integration of the semiconductor package 100.

The method of manufacturing the semiconductor package 100 may include the forming of the solder passivation layers 140 that maintain the shapes of the first solder balls 132 when the first and second solder balls 132 and 134 are coupled to each other. Accordingly, when the first and second solder balls 132 and 134 are coupled to each other, the first and second solder balls 132 and 134 are prevented from expanding to the adjacent connection terminals 130.

The method of manufacturing the semiconductor package 100 may include the forming of the short prevention parts 152. When the first and second solder balls 132 and 134 are coupled to each other, the short prevention parts 152 may guide the second solder balls 134 to be disposed only in the attachment surfaces 142 of the solder passivation layers 140, thus preventing bridging between the connection terminals 130.

The method of manufacturing the semiconductor package 101 is similar to that of manufacturing the semiconductor package 100. First solder passivation layers 141 and first prevention parts 154 may be formed by same method of forming the solder passivation layers 140 and the short prevention parts 152 (refer to FIG. 1A). Additionally, second solder passivation layers 143 may be formed on the second solder balls 134. Second prevention parts 153 may be formed surrounding the bottom surface of the second solder balls 134. The second solder passivation layers 143 and the second prevention parts 153 may be formed by similar process of forming the solder passivation layers 140 and the short prevention parts 152. Additionally, the second solder passivation layers 143 and the second prevention parts 153 may be formed to expose the bottom surface of the second solder balls 134.

Hereinafter, a method of manufacturing a semiconductor package 102 according to another embodiment will now be described in detail. The same description as the above descriptions of the semiconductor package 100 and 101 will be omitted or simplified.

Figure 4:
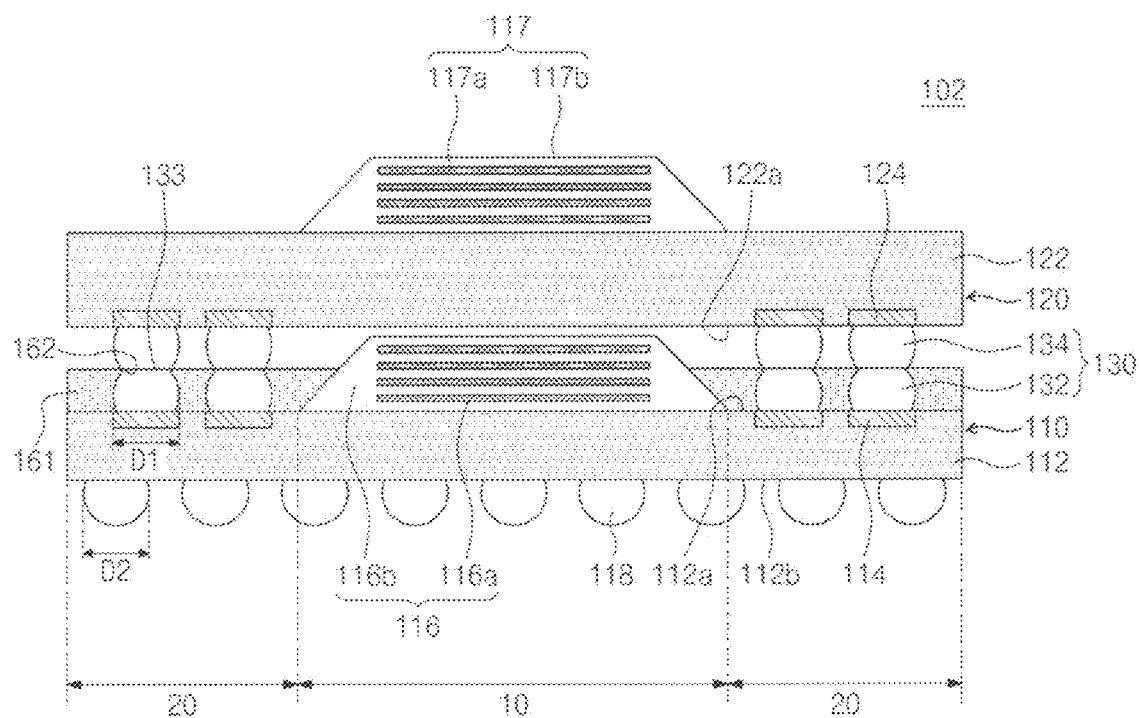
FIG. 4 is a schematic view illustrating a semiconductor package according to another embodiment of the inventive concept.

FIG. 4 is a schematic view illustrating the semiconductor package 102. Referring to FIG. 4, the semiconductor package 102 may have a package on package (POP) structure that is formed by stacking a plurality of packages. For example, the semiconductor package 102 may include the first and second packages 110 and 120 that are coupled to each other through the connection terminals 130. The first and second packages 110 and 120 of the current embodiment may be approximately the same as the first and second packages 110 and 120 described with reference to FIG. 1A. The connection terminals 130 may have a structure in which two types of solder balls are stacked. For example, the connection terminals 130 may include the first and second solder balls 132 and 134 that are vertically arrayed. The first solder balls 132 are attached to the first connection pads 114 on the upper surface 112a of the first substrate 112. The second solder balls 134 may be attached to the second connection pads 124 on the surface 122a of the second substrate 122. The electrical device 116 is disposed in the center 10 of the upper surface 112a. The connection terminals 130 may be disposed at the edges 20 of the upper surface 112a. The electrical device 116 may include the stacked semiconductor integrated circuit chips 116a and the chip passivation layer 116b covering the semiconductor integrated circuit chips 116a. The electrical device 117 is disposed on the second substrate 122. The electrical device 117 may include the stacked semiconductor integrated circuit chips 117a and the chip passivation layer 117b covering the semiconductor integrated circuit chips 117a. The external connection terminals 118 may be disposed on the lower surface 112b of the first substrate 112. The first solder balls 132 may have the flat surfaces 133 in the upper portions thereof. The sizes of the first and second solder balls 132 and 134 may be equal to or less than the sizes of the external connection terminals 118. For example, the diameters D1 of the first and second solder balls 132 and 134 may be equal to or less than the diameters D2 of the external connection terminals 118.

The semiconductor package 102 may further include a solder passivation layer 161 that is disposed between the first package 110 and the second package 120 and covers the connection terminals 130. For example, the solder passivation layer 161 may be disposed on the upper surface 112a of the first substrate 112 to cover the first solder balls 132. In this case, the solder passivation layer 161 may cover at least one portion of the electrical device 116. The solder passivation layer 161 may include openings 162 that may be holes exposing the flat surfaces 133 of the first solder balls 132. The first and second solder balls 132 and 134 may be directly connected to each other through the openings 162. The solder passivation layer 161 may be formed of insulating material. For example, the solder passivation layer 161 may include at least one of photo solder resist (PSR) and resin-based adhesive. Alternatively, the solder passivation layer 161 may include epoxy molding compound.

Hereinafter, a method of manufacturing a semiconductor package according to another embodiment will now be described in detail. The same description as the above descriptions of the semiconductor package 102 will be omitted or simplified.

FIGS. 5A through 5E are schematic views illustrating a method of manufacturing the semiconductor package according to the current embodiment.

Figure 5A:
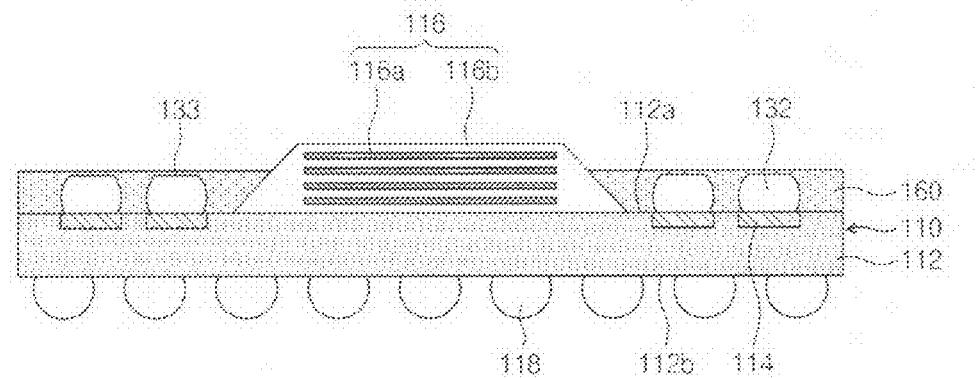
FIGS. 5A through 5E are schematic views illustrating a method of manufacturing a semiconductor package according to another embodiment of the inventive concept.

Referring to FIG. 5A, the first package 110 may be prepared. Since the preparing of the first package 110 includes the preparing of the first package 110 of FIG. 2A, a description thereof will not be repeated. The preparing of the first package 110 according to the current embodiment may further include forming an insulating layer 160 on the upper surface 112a. The insulating layer 160 may cover the first solder balls 132 on the upper surface 112a of the first substrate 112. The insulating layer 160 may include at least one of photo solder resist (PSR), resin-based adhesive, and epoxy molding compound.

Figure 5B:
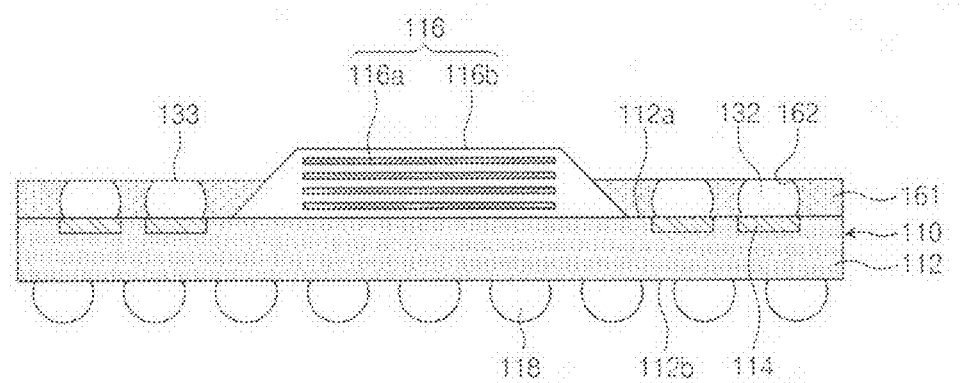

Referring to FIG. 5B, the solder passivation layer 161 may be formed. The solder passivation layer 161 may be coplanar with the flat surfaces 133. For example, the insulating layer 160 (refer to FIG. 5A) may be partially removed to expose the flat surfaces 133 of the first solder balls 132. However, a method of removing the insulating layer 160 is not limited thereto. For example, the removing of the insulating layer 160 may include performing a planarization process on the insulating layer 160 using the flat surfaces 133 as an etch stop layer. Alternatively, the removing of the insulating layer 160 may include removing only portions of the insulating layer 160 on the flat surfaces 133 to expose the flat surfaces 133. For example, a laser beam may be irradiated to the insulating layer 160 on the flat surfaces 133 to partially remove the insulating layer 160. Through the above processes, the solder passivation layer 161 may include the openings 162 that expose the flat surfaces 133.

Figure 5C:
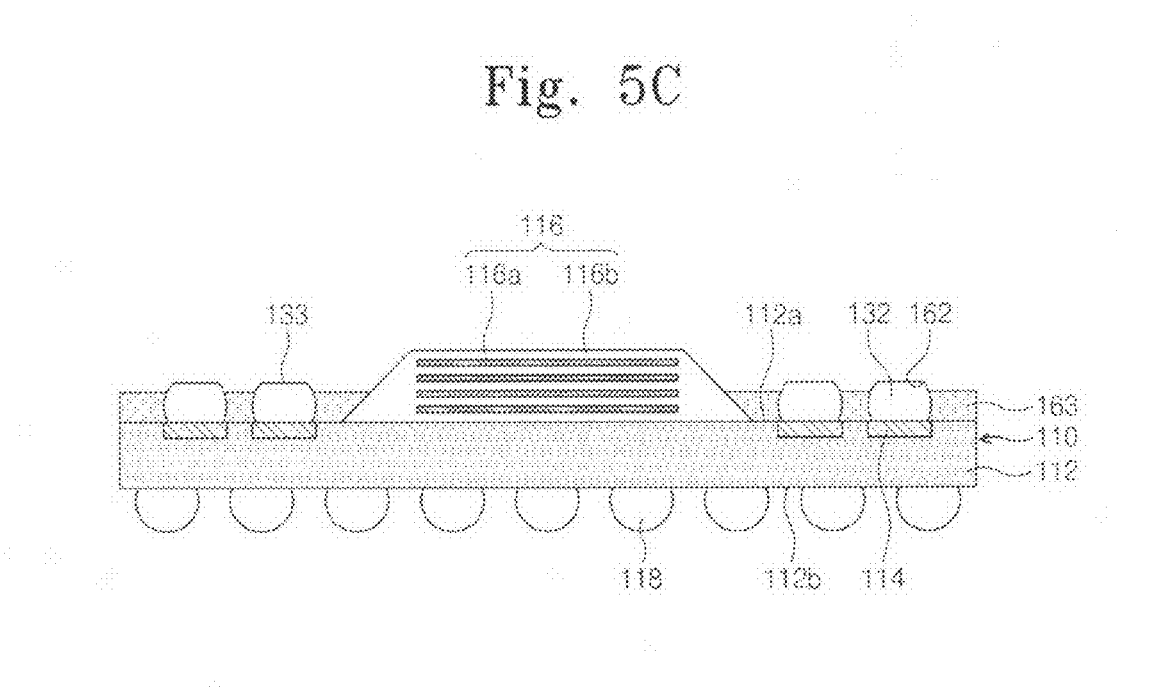

FIG. 5C shows a modified embodiment of the solder passivation layer. According to a modified embodiment, a solder passivation layer 163 may have a top surface lower than the flat surfaces 133. The solder passivation layer 163 may be formed by more removing the insulating layer 160 comparing with the solder passivation layer 161 (refer to FIG. 5B).

Figure 5D:
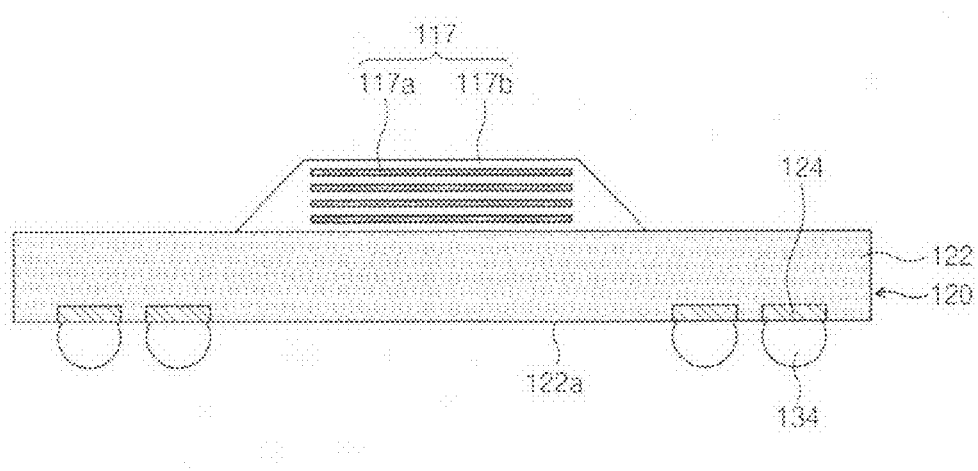

Referring to FIG. 5D, the second package 120 may be prepared. The preparing of the second package 120 may include preparing the second substrate 122 having the surface 122a provided with the second connection pads 124. The preparing of the second substrate 122 may further include attaching the second solder balls 134 onto the second connection pads 124. The preparing of the second substrate 122 may further include forming an electronic device 117 on the second substrate 122. The forming of the electrical device 117 may include stacking the semiconductor integrated circuit chips 117a, and forming the chip passivation layer 117b covering the semiconductor integrated circuit chips 117a.

Figure 5E:
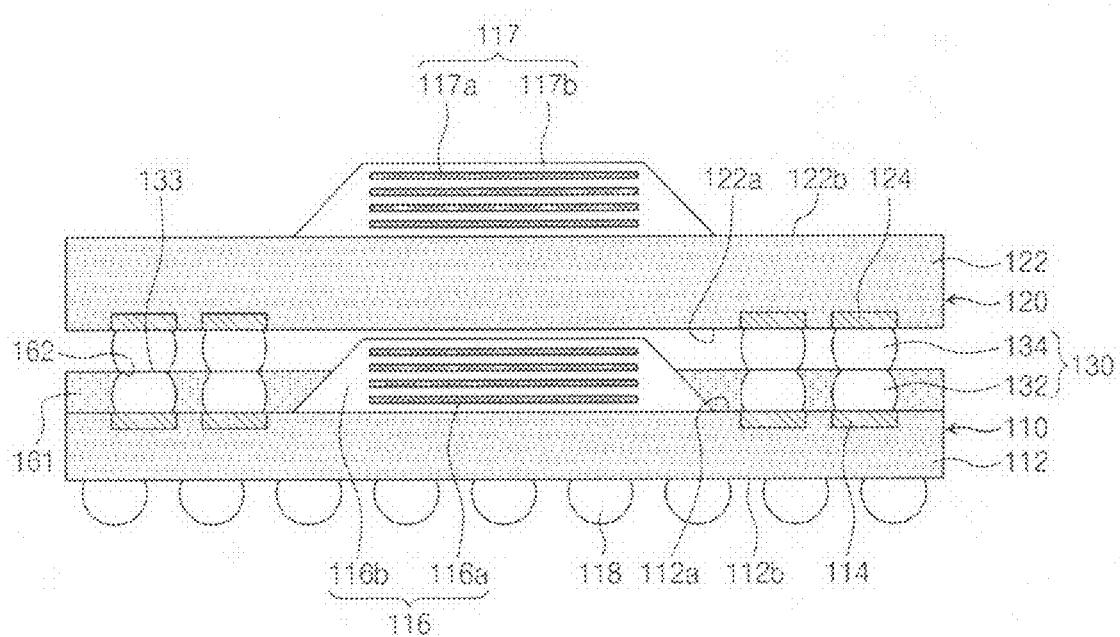

Referring to FIG. 5E, the first package 110 may be coupled to the second package 120. The coupling of the first and second packages 110 and 120 may include disposing the first and second packages 110 and 120 to position the second solder balls 134 on the flat surfaces 133 of the first solder balls 132, and heat-treating the first and second solder balls 132 and 134. In the heat-treating of the first and second solder balls 132 and 134, the solder passivation layer 161 may maintain the shapes of the first solder balls 132. The solder passivation layer 161 may function as the short prevention parts 152 (refer to FIG. 1A). For example, the solder passivation layer 161 may prevent melted portions of the second solder balls 134 from expanding to the adjacent connection terminal 130 while heat-treating the first and second solder balls 132 and 134.

Figure 6:
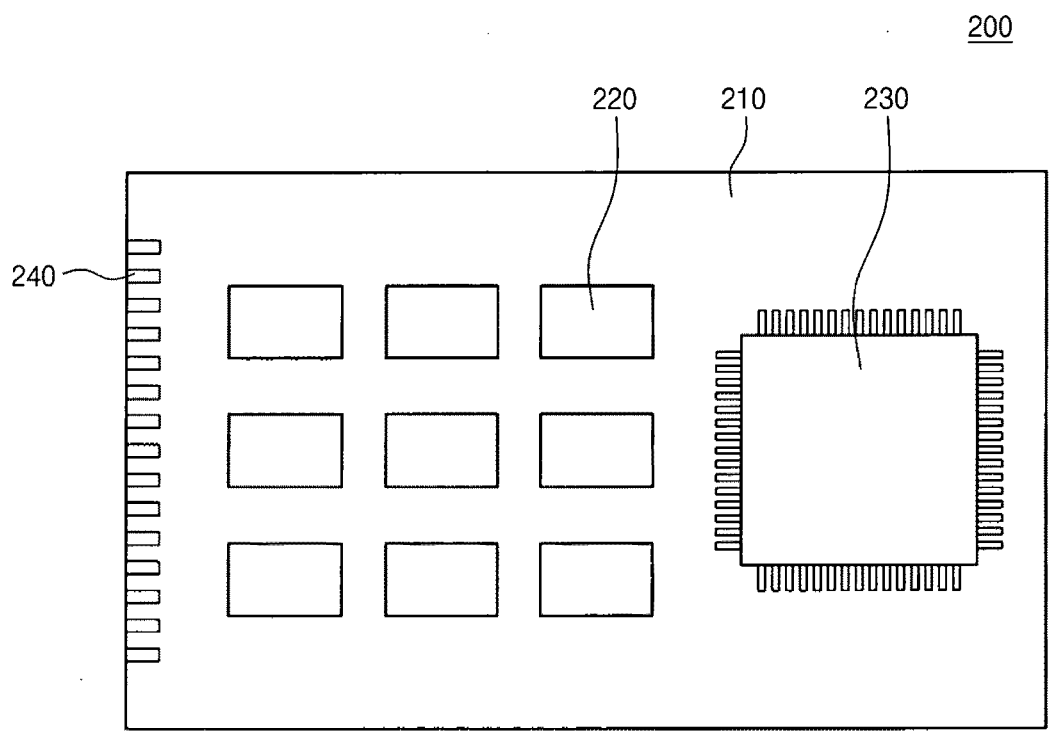
FIG. 6 is a schematic view illustrating a package module including a semiconductor package, according to an embodiment of the inventive concept.

FIG. 6 is a schematic view illustrating a package module 200 including semiconductor devices, according to an embodiment of the inventive concept. Referring to FIG. 6, the aforementioned semiconductor package may be applied to semiconductor devices 220 and the package module 200 including the semiconductor devices 220. For example, the package module 200 may include the semiconductor devices 220 and a quad flat package (QFD) semiconductor device 230. The semiconductor package 100 of FIG. 1A, and the semiconductor package 102 of FIG. 4 may be applied to the semiconductor devices 220 and the QFD semiconductor device 230. The semiconductor devices 220 and the QFD semiconductor device 230 may be installed on a semiconductor substrate 210 to form the package module 200. The semiconductor substrate 210 may include a printed circuit board. As described above, the semiconductor packages 100, 101 and 102 may be formed by coupling the packages 110 and 120 through the connection terminals 130 (refer to FIGS. 1 and 4) including the vertically stacked solder balls 132 and 134. Accordingly, the number of semiconductor integrated circuit chips disposed between the semiconductor packages 100, 101 and 102 can be increased to improve the integration of the package module 200.

Figure 7:
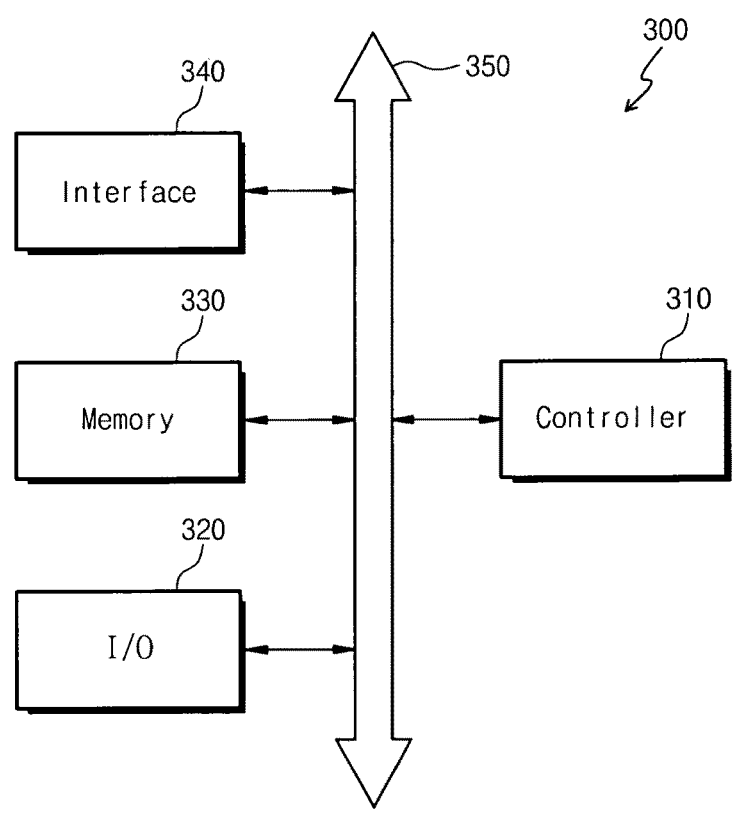
FIG. 7 is a block diagram of an electronic system including a semiconductor device, according to an embodiment of the inventive concept.

FIG. 7 is a block diagram of an electronic system 300 including a semiconductor device, according to an embodiment of the inventive concept. For example, the electronic system 300 may include a controller 310, an input/output device 320, and a memory device 330 that are coupled to each other through a bus 350 that may be a passage through which data is transmitted. The controller 310 and the memory device 330 may include the semiconductor package 100 of FIG. 1A, the semiconductor package 101 of FIG. 1B and the semiconductor package 102 of FIG. 4. The input/output device 320 may include at least one of a keypad, a keyboard, and a display device. The memory device 330 may store data. The electronic system 300 may further include an interface 340 for transmitting and receiving data through communication network. A mobile system, a personal computer, an industrial computer, a wireless communication device, and a logic system performing various functions may be realized through the electronic system 300. As described above, the semiconductor packages 100, 101 and 102 may be formed by coupling the packages 110 and 120 through the connection terminals 130 (refer to FIGS. 1 and 4) including the vertically stacked solder balls 132 and 134. Accordingly, the number of semiconductor integrated circuit chips disposed between the semiconductor packages 100, 101 and 102 can be increased to improve the integration of the electronic system 300.

Figure 8:
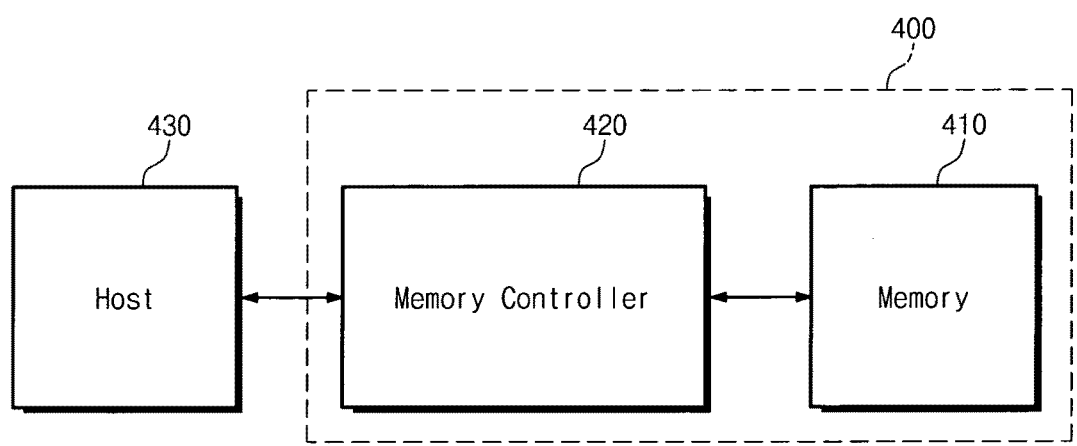
FIG. 8 is a block diagram of a memory system including a semiconductor device, according to an embodiment of the inventive concept.

FIG. 8 is a block diagram of a memory system including a semiconductor device according to an embodiment of the inventive concept. Referring to FIG. 8, the semiconductor device may be a memory card 400. For example, the memory card 400 may include a memory device 410 and a memory controller 420 that include the semiconductor package 100 of FIG. 1A, the semiconductor package 101 of FIG. 1B, and the semiconductor package 102 of FIG. 4. The memory device 410 may include a non-volatile memory device. In response to the read/write request of a host 430, the memory controller 420 may control the memory device 410 to read stored data or store data. As described above, the semiconductor packages 100, 101 and 102 may be formed by coupling the packages 110 and 120 through the connection terminals 130 (refer to FIGS. 1A, 1B and 4) including the vertically stacked solder balls 132 and 134. Accordingly, the number of semiconductor integrated circuit chips disposed between the semiconductor packages 100, 101 and 102 can be increased to improve the integration of the memory card 400.

The semiconductor package according to the embodiments of the inventive concept includes the solder balls that are vertically stacked between the packages and prevent bridging. Accordingly, the distance between the packages can be increased, and a fine ball pitch can be achieved.

The above-described subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor package comprising:
    a first package and a second package;
    a connection terminal disposed between the first and second packages and including a first solder ball and a second solder ball that are stacked;
    a conductive solder passivation layer disposed between the first solder ball and the second solder ball, the conductive solder passivation layer extended to coat a side surface of at least one of the first and second solder balls, and
    a non-conductive short prevention part surrounding a coupling portion between the first and second solder balls, wherein the short prevention part extends beyond the diameters of both solder balls and exposes side surfaces of the first solder ball and the second solder ball.

2. The semiconductor package of claim 1, wherein the solder passivation layer comprises a metal that has a higher melting point than that of the connection terminal.

3. The semiconductor package of claim 1, wherein the solder passivation layer comprises at least one of copper (Cu), nickel (Ni), gold (Au), titanium (Ti), tungsten (W), chromium (Cr), and vanadium (V).

4. A semiconductor package comprising:
    a first package and a second package;

a connection terminal disposed between the first and second packages and including a first solder ball and a second solder ball that are stacked;

a conductive solder passivation layer disposed between the first solder ball and the second solder ball, the conductive solder passivation layer extended to coat a side surface of at least one of the first and second solder balls; and a ring-shaped short prevention part surrounding a coupling portion between the first and second solder balls, wherein the ring-shaped short prevention part is non-conductive and extends beyond the diameters of both solder balls and exposes side surfaces of the first solder ball and the second solder ball.

5. The semiconductor package of claim 4, wherein the ring-shaped short prevention part comprises a first short prevention part disposed on the first solder ball and a second short prevention part disposed on the second solder ball.

6. The semiconductor package of claim 1, wherein the first solder ball and second solder ball are electrically connected to each other.

7. A semiconductor package comprising:

a first package and a second package;

a connection terminal disposed between the first and second packages and including a first solder ball and a second solder ball that are stacked, the first solder ball connected to the first package and the second solder ball connected to the second package;

a non-conductive short prevention part surrounding a coupling portion between the first and second solder balls which extends beyond the diameters of both solder balls and exposes side surfaces of the first solder ball and the second solder ball; and a conductive solder passivation layer disposed between the first solder ball and the second solder ball, the conductive solder passivation layer extended to coat side surfaces of the first and second solder balls.

8. The semiconductor package of claim 7, wherein the non-conductive short prevention part is ring-shaped.

9. The semiconductor package of claim 7, wherein the short prevention part includes at least one of a photo solder resist (PSR) and resin-based adhesive.

10. The semiconductor package of claim 7, wherein the diameter of the second solder ball is substantially equal to that of the first solder ball.

11. The semiconductor package of claim 7, further comprising:

an external connection terminal on the first package, wherein the diameters of the first and second solder balls are less than that of the external connection terminal.

12. The semiconductor package of claim 1, wherein the non-conductive short prevention part is spaced apart from the first and second packages.

13. The semiconductor package of claim 1, wherein the non-conductive short prevention part includes a plurality of non-conductive short prevention parts spaced apart from each other.

* * * * *